(12) United States Patent
Hsieh

(10) Patent No.: US 6,483,334 B1
(45) Date of Patent: Nov. 19, 2002

(54) METHOD FOR RELIABILITY TESTING OF SEMICONDUCTOR IC

(75) Inventor: Kuo-Hua Hsieh, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/670,384

(22) Filed: Sep. 28, 2000

(51) Int. Cl.$^7$ ............................................. G06F 19/00
(52) U.S. Cl. ...................... 324/760; 324/158.1; 29/27
(58) Field of Search ............................. 324/158.1, 760, 324/754; 438/14, 18; 29/827, 27; 382/145; 702/118

(56) References Cited

U.S. PATENT DOCUMENTS

| | | | | |
|---|---|---|---|---|
| 4,214,364 A | * | 7/1980 | St. Louis et al. | 29/827 |
| 4,985,988 A | * | 1/1991 | Littlebury | 29/827 |
| 5,787,190 A | * | 7/1998 | Peng et al. | 382/145 |
| 5,831,445 A | * | 11/1998 | Atkins et al. | 324/760 |
| 6,049,624 A | * | 4/2000 | Wilson et al. | 382/145 |
| 6,208,947 B1 | * | 3/2001 | Beffa | 438/14 |
| 6,175,812 B1 | * | 1/2002 | Boyington et al. | 324/760 |

* cited by examiner

Primary Examiner—Michael Sherry
Assistant Examiner—Jimmy Nguyen
(74) Attorney, Agent, or Firm—Winston Hsu

(57) ABSTRACT

A semiconductor wafer is provided, which comprises at least a first die and a second die, which are grouped into different regions according to a wafer map. A saw and assembly process is performed, which packages the first dies and the second dies into a first packaged unit and a second packaged unit, respectively. A first burn-in test on the first packaged unit is performed for a first testing period to eliminate dies that fail at infancy. A second burn-in test on the second package unit is performed for a second time period to eliminate dies that fail at infancy. The first time period is shorter than the second time period.

17 Claims, 4 Drawing Sheets

METHOD FOR RELIABILITY TESTING OF SEMICONDUCTOR IC

BACKGROUND OF THE INVENTION

1. Field of the Invention

The present invention relates to a reliability testing method for semiconductor ICs, and more particularly, to a method for reliability testing that not only reduces the cost of burn-in testing, but also improves the reliability of the IC products.

2. Background of the Invention

An index of the reliability of a wafer is the failure rate, which is termed "fit" (failure unit), and is the total number of device failures in $10^9$ device-hours. The reliability of a wafer indicates the survival rate (as opposed to the failure rate); the higher the survival rate, i.e. the lower the failure rate, the better the reliability of the product.

Please refer to FIG. 1. FIG. 1 is a graph of failure rate vs. lifetime for a semiconductor product according to the prior art. As shown, a semiconductor product has a higher failure rate at the beginning of its life time, but as time goes by, its failure rate decreases in stage A, which is also called the "infant mortality stage". As the product passes a certain point in its lifetime, the failure rate reaches the lowest point in stage B, which is also called the "useful life stage". After passing the useful life stage, the product's failure rate increases rapidly in stage C, which is also known as the "wear out stage." The infant mortality stage, useful life stage and wear out stage that a semiconductor product goes through form a curve shaped like a bathtub. A testing engineer decides if a product is to be sold or discarded by measuring its failure rates in the three stages and checking if it is lower than a required failure rate.

Please refer to FIG. 2. FIG. 2 is a flow chart of a reliability test for wafers according to the prior art. As shown here, a semiconductor wafer is manufactured in step 10, the wafer comprising a plurality of dies. Next, in step 12, a circuit probe test is performed on the wafer, which is also called a wafer probe test. According to this testing result, the dies are sorted into functional dies and non-functional dies. The non-functional dies do not participate in the rest of the testing processes. The functional dies singled out in step 12, however, go through a first a saw and assembly process (step 14), and then a package testing process (step 16). After the package testing process (step 16), a few dies that have broken or failed in the packaging process are discarded, and the majority that have passed the package testing process are sent to a burn-in test, which removes those that fail in infancy (step 18). Finally, a final test is performed on those that have passed the burn-in test to evaluate the quality of the product.

According to the prior art, after a wafer goes through a circuit probe test, all the functional dies go on to the saw and assembly process and the burn-in test. However, the time period of the burn-in test is between 24 and 48 hours, and may sometimes even exceed 48 hours. This wastes a great deal of time, incurring high costs and resulting in uncontrollable failure rates, and may even delay the product release deadline.

SUMMARY OF THE INVENTION

It is therefore the primary objective of this invention to provide a selective reliability testing method to reduce production costs and to increase product reliability.

The present invention provides a reliability testing method for wafers. In this method, a semiconductor wafer is first provided, and the wafer comprises at least a first die and a second die, which are grouped into different regions according to a wafer map. A saw and assembly process is executed, packaging the first dies and the second dies into first and second packaged units, followed by a burn-in test. The burn-in test is performed on the first packaged unit for a first testing period to eliminate the dies that have failed in infancy, and is performed on the second packaged unit for a second testing period to eliminate those dies that have fail in infancy. The first testing period is shorter than the second testing period.

These and other objectives of the present invention will no doubt become obvious to those of ordinary skill in the art after having read the following detailed description of the preferred embodiment that is illustrated in the various figures and drawings.

DETAILED DESCRIPTION OF THE PRESENT INVENTION

Figure 1:
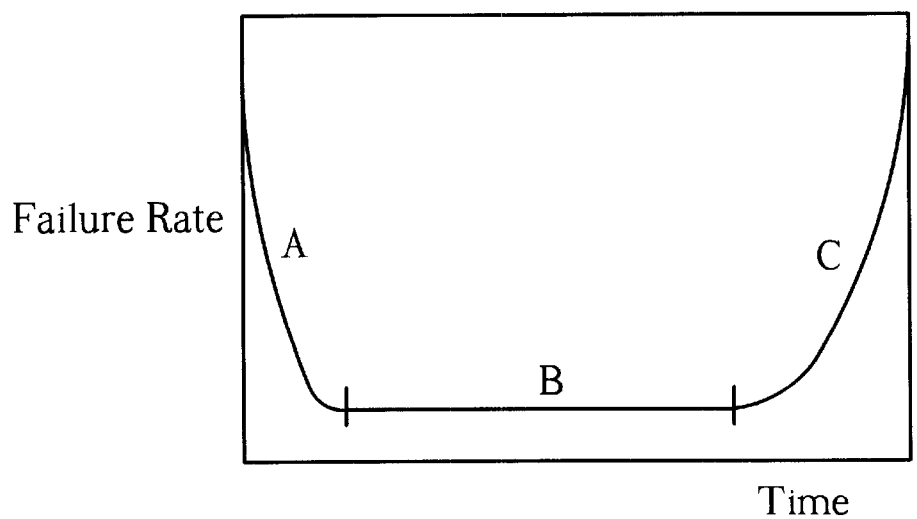
FIG. 1 is a graph of failure rate vs. lifetime for a semiconductor product according to the prior art.
Figure 3:
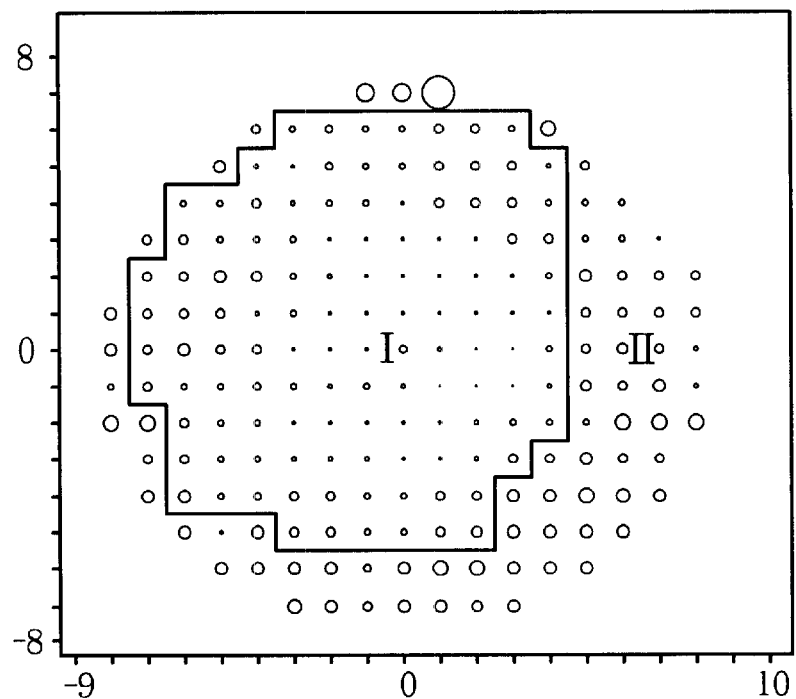
FIG. 3 is a view of a wafer map generated based on the failure rate obtained from a burn-in test.
Figure 2:
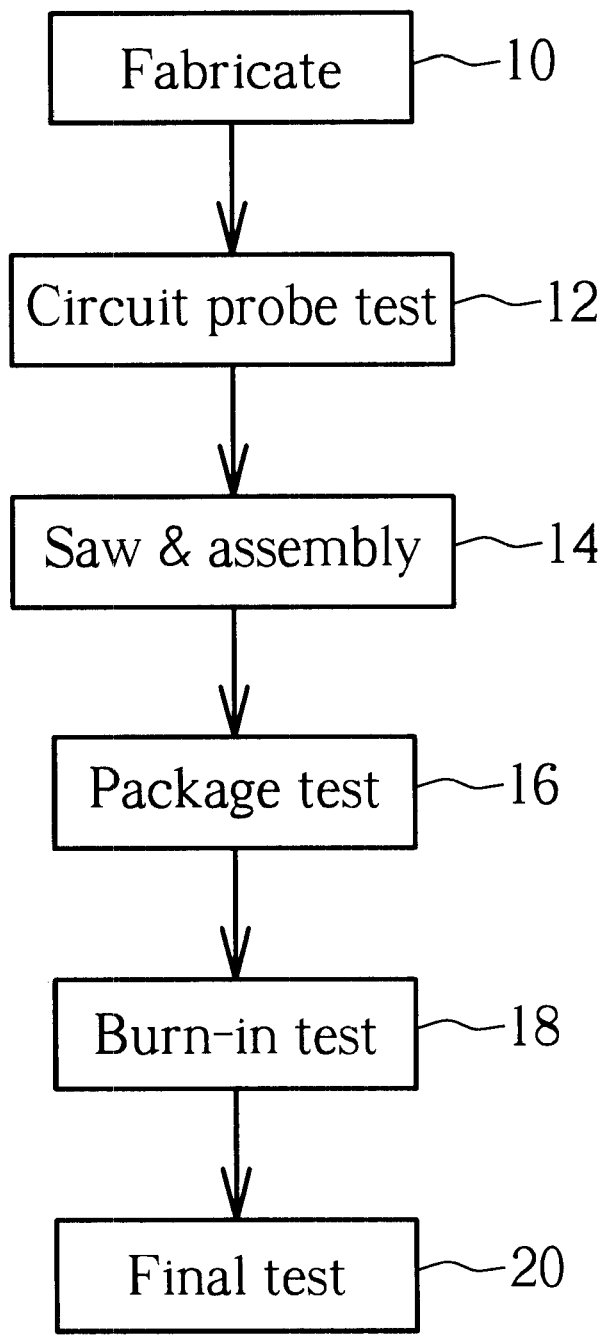
FIG. 2 is a flow chart of a reliability test for wafers according to the prior art.

Please refer to FIG. 3. FIG. 3 is a view of a wafer map generated based on a failure rate obtained from a burn-in test. The wafer map in FIG. 3 is generated from a great number of experimental results. As shown in the map, the dies in the center region I have a relatively lower failure rate (depicted in smaller circles) in comparison to the dies in the peripheral region II (depicted in larger circles); in other words, the dies of the center region I have a higher reliability than the dies in the peripheral region.

Factors that contribute to the fact that the dies in the peripheral region II have diminished reliability include: (1) the difference in the nature of deposited films; (2) unevenness in etching; (3) wafer polishing effects; (4) partial field lithography effects; and (5) facility production errors, etc. A failure in burn-in testing, for instance, is often caused by an incomplete metal etching around the peripheral region, and results in further testing failures.

Figure 4:
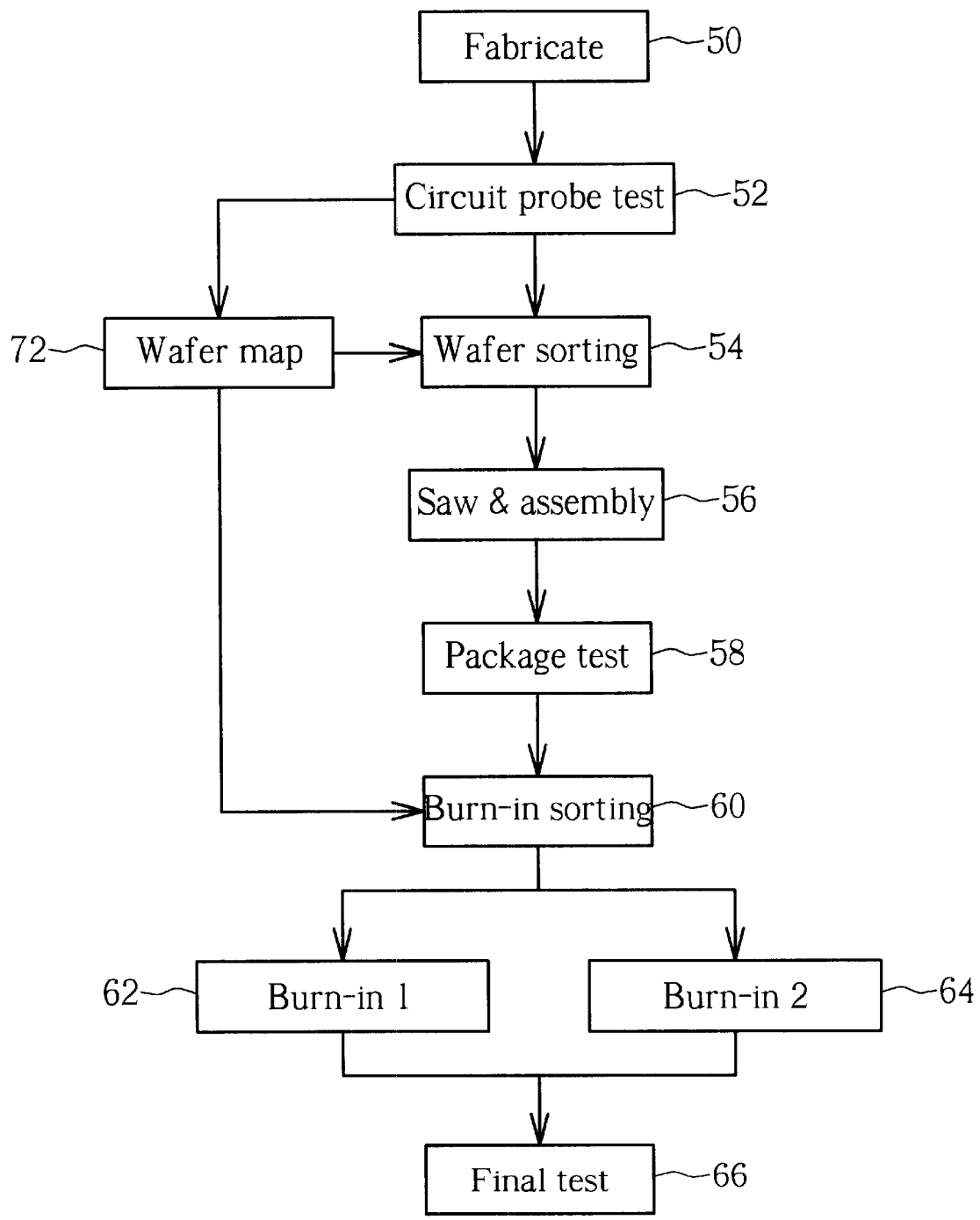
FIG. 4 is a flow chart of a reliability test for semiconductor products according to the present invention.

Please refer to FIG. 4. FIG. 4 is a flow chart of a reliability test for semiconductor products according to the present invention. As shown in FIG. 4, a semiconductor product is first fabricated in step 50, the semiconductor product being a wafer comprising a plurality of dies. Next, in step 52, a circuit probe test is performed on the wafer, and the dies are grouped as functional dies and non-functional dies based on the test results. The non-functional dies do not participate in the following processes.

A wafer map 72 is obtained in step 52. The wafer map 72 is based on the results of the probe test for each die, and on the arrangement of these dies on the wafer. The wafer map 72 indicates regions of higher failure rate and regions of lower failure rate. As stated previously, the dies with a higher failure rate (lower reliability) are usually located in the peripheral region of a wafer, whereas the dies with a lower failure rate (higher reliability) are usually located in the center region of the wafer. According to the failure rate, a wafer can be divided into a plurality of regions that extend outwardly from the center point. The number of regions will depend on the size of the wafer, the distribution of the failure rates, and on experimental results. For example, an 8-inch wafer can be divided into 3 regions, from the center region outward to the peripheral region. The region closest to the center will have the lowest failure rate and the most peripheral region will have the highest failure rate.

Next, in step 54, a wafer sorting process is executed according to the wafer map 72 to give a code to each region. The codes given to the regions of the dies assists when assembling the dies in the following saw and assembly process according to the regions allocated by the wafer map 72. There are many coding methods, such as marking the regions of the dies with ink, laser or sawed directly by the packaging company according to the regions allocated by the wafer map 72. Regardless of the method used, the point of the coding is to distinguish the assembled and packaged units based on the different regions allocated by the wafer map 72.

After the dies on the wafer are sorted according to the wafer map 72, a saw and assembly process is executed in step 56. In the preferred embodiment of the present invention, the dies are assembled directly by a packaging company in a saw and assembly process according to the wafer map 72. For example, if the dies of a wafer are divided into two regions based on the wafer map 72, the dies, after the saw and assembly process, would be packed into a first packaged unit and a second packaged unit, each having a different failure rate. Next, a package test is performed in step 58. The procedure of the package test is the same as in the prior art and is well known in the field, and so need not be elaborated on here.

After the package test, a minority of the products ruined in the saw and assembly process are eliminated, while the majority of the products are sent, in the first packaged unit and the second packaged unit, to a first burn-in test and a second burn-in test respectively. The burn-in test eliminates any products that fail in infancy (step 60). Such a failure is termed an "infant mortality". In the preferred embodiment of the invention, with the two regions drawn out according to the wafer map 72 as an example, the dies are packed into a first packaged unit and a second packaged accordingly. The first burn-in test is performed on the first packaged unit (the dies closer to the center) in step 62, and the second burn-in test is performed on the second packaged unit (the dies closer to the periphery in step 64). The burn-in test for both packaged units is designed to induce infant mortality in the units.

The stress temperature at which the first and the second burn-in tests is between 50 to 200° C., typically at 125° C., and the stress voltage is 1 to 2 (typically 1.3) times of the VCC (operating voltage). The test period of the first burn-in test is less than 12 hours, and can be adjusted to less than 6 hours, depending on the failure rate. The testing period of the second burn-in test is longer than 24 hours, sometimes exceeding 48 hours in order to ensure the reliability of the second packaged unit. Finally, a final test is performed in step 66 to evaluate the electrical properties of the product.

In the preferred embodiment of the invention, since the first packaged unit has a higher reliability, the first burn-in test can be skipped in order to save time and money associated with the burn-in test. To make the assembly of the dies more closely match the actual distribution of the failure rates, a more accurate wafer map can be procured as a standard wafer map for comparison when sorting dies. The standard wafer map is obtained by sorting, packaging and running a burn-in test on a sample wafer, and obtaining a failure rate distribution and a corresponding wafer map, and comparing this wafer map to the wafer map obtained by a circuit probe test and revising it accordingly.

Figure 5:
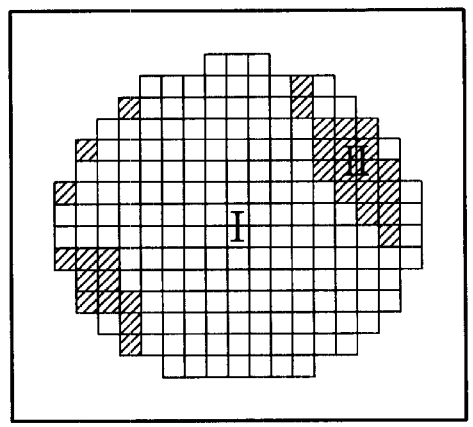
FIG. 5 is a view of a wafer map showing the failure rate distribution of a sample wafer obtained by a burn-in test.

Please refer to FIG. 5. FIG. 5 is a view of a wafer map showing the failure rate distribution of a sample wafer obtained by a burn-in test. As shown, the darker region II, which is close to the periphery of the wafer, represents dies with a higher failure rate. The white region I represents dies with lower failure rate. Using this wafer map, the dies of the wafer can be divided into first region dies of the white region I, and second region dies of the dark region II.

Figure 6:
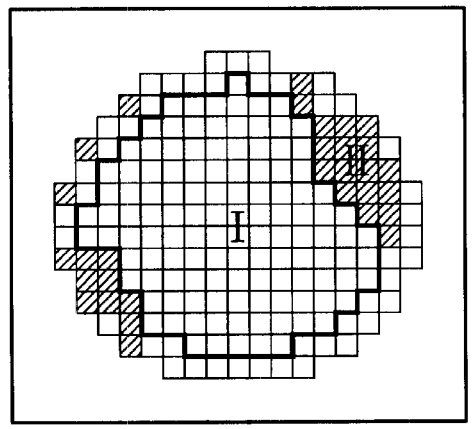
FIG. 6 is a view of a revised wafer map from the the wafer map of FIG. 5.

Please refer to FIG. 6. FIG. 6 is a view of a revised wafer map from the one in FIG. 5. As shown in FIG. 6, the wafer map still has two regions, region I and II, region I being the center region and having a lower failure rate, region II being the peripheral region and having a higher failure rate.

Figure 7:
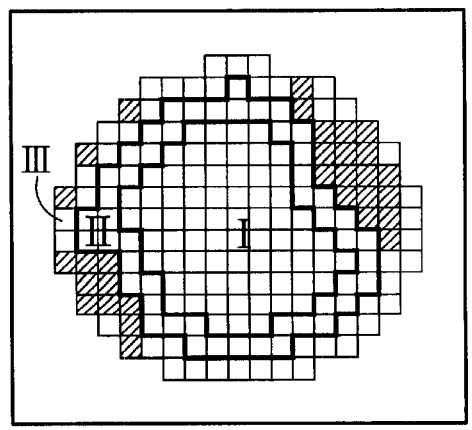
FIG. 7 is a revised wafer map from the wafer map of FIG. 6.

Please refer to FIG. 7. FIG. 7 is a revised wafer map from the one in FIG. 6. As shown in FIG. 7, matching more closely the actual failure rate distribution, the wafer is now divided into three regions, region I, II, and III. Region I is closest to the center and has the lowest failure rate. Region III is close to the periphery and has the highest failure rate. Region II is located between region I and III. According to the present method, the dies in the three regions are packaged, based on this wafer map, into a first packaged unit, a second packaged unit and a third packaged unit. A first burn-in test, a second burn-in test and a third burn-in test are performed on the first, second and third packaged units, respectively. The first burn-in test has the shortest testing period. The second burn-in test has a longer testing period than the first burn-in test. The third burn-in test has the longest testing period. Moreover, as stated previously, the first packaged unit has the highest reliability, so the first burn-in test could optionally be omitted in order to reduce costs.

The present invention is not limited to three regions for a wafer map. A wafer map might have n regions, depending on the size of the wafer, the experience of testing engineers and on the requirements of the quality control standards. Burn-in tests of various testing periods are performed on the dies for each region. In this way, testing costs are greatly reduced, and the reliability of the product is increased.

Compared to the prior art, the dies of a wafer in the present invention are divided by a wafer map 72 into several regions before packaging, and are sawed and assembled according to these divisions into different packaged units. Each packaged unit then undergoes a burn-in test for a different testing period.

The present invention provides a reliability testing method that can significantly reduce testing costs and increases the reliability of the semiconductor product.

The above disclosure is based on the preferred embodiment of the present invention. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of reliability testing for a semiconductor product, the method comprising:

provinding a semiconductor wafer comprising a first die and a second die located in a first region and a second region, respectively, of the semiconductor wafer, and the first region and the second region being discriminated and divided according to a wafer map;

executing a packaging procedure to saw the semiconductor wafer and assemble the first die into a first packaged unit, and assemble the second die into a second packaged unit;

performing a first burn-in test on the first packaged unit for a first time period to induce infant mortality in the first packaged unit; and performing a second burn-in test on the second packaged unit for a second time period to induce infant mortality in the second packaged unit;

wherein the first time period is shorter than the second time period.

2. The method of claim 1 wherein the wafer map is generated by performing a wafer probe test.

3. The method of claim 1 wherein the first region is a wafer center region and the second region is a wafer periphery region.

4. The method of claim 1 wherein the first die and the second die are both functional dies.

5. The method of claim 1 wherein a stress temperature used in the first burn-in test and the second burn-in test is between 50 to 200° C.

6. The method of claim 1 wherein a stress voltage used in the first burn-in test and the second burn-in test is 1 to 2 times greater than the Vcc (operating voltage) of the first packaged unit or the second packaged unit.

7. The method of claim 1 wherein the first time period is less than 6 hours.

8. The method of claim 1 wherein the second time period is longer than 24 hours.

9. The method of claim 1 wherein the method further comprises performing a test procedure on the first packaged unit and the second packaged unit both before and after the first burn-in test and the second burn-in test.

10. A method of a reliability testing for a semiconductor product, the method comprising:

providing a semiconductor wafer comprising a first die and a second die located in a first region and a second region, respectively, of the semiconductor wafer, and the first region and the second region being discriminated and divided according to a wafer map;

executing a packaging procedure to saw the semiconductor wafer and assemble the first die into a first packaged unit and assemble the second die into a second packaged unit; and performing a burn-in test on the second packaged unit for a predetermined time period to induce infant mortality of the second packaged unit;

wherein the reliability of the first packaged unit is higher than the reliability of the second packaged unit and no burn-in test is applied to the first packaged unit.

11. The method of claim 10 wherein the wafer map is generated by performing a wafer probe test.

12. The method of claim 10 wherein the first region is a wafer center region and the second region is a wafer periphery region.

13. The method of claim 10 wherein the first die and the second die are all functional dies.

14. The method of claim 10 wherein a stress temperature used in the burn-in test is between 50 to 200° C.

15. The method of claim 10 wherein a stress voltage used in the burn-in test is 1 to 2 times greater than the Vcc (operating voltage) of the second packaged unit.

16. The method of claim 10 wherein the predetermined time period is between hours to tens of hours.

17. The method of claim 10 wherein the method further comprises performing a test procedure on the second packaged unit both before and after the burn-in test.

* * * * *